US008933553B2

(12) United States Patent
Nishi et al.

(10) Patent No.: US 8,933,553 B2
(45) Date of Patent: Jan. 13, 2015

(54) SEMICONDUCTOR UNIT

(71) Applicant: Kabushiki Kaisha Toyota Jidoshokki, Kariya-shi, Aichi-ken (JP)

(72) Inventors: Shinsuke Nishi, Aichi-ken (JP); Shogo Mori, Aichi-ken (JP); Yuri Otobe, Aichi-ken (JP); Naoki Kato, Aichi-ken (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 0 days.

(21) Appl. No.: 13/934,858

(22) Filed: Jul. 3, 2013

(65) Prior Publication Data

US 2014/0008781 A1 Jan. 9, 2014

(30) Foreign Application Priority Data

Jul. 6, 2012 (JP) ................. 2012-152579

(51) Int. Cl.
| | |
|---|---|
| *H01L 23/52* | (2006.01) |
| *H01L 23/373* | (2006.01) |
| *H01L 23/467* | (2006.01) |
| *H01L 23/00* | (2006.01) |
| *H01L 25/07* | (2006.01) |
| *H05K 7/14* | (2006.01) |
| *H01L 23/64* | (2006.01) |
| *H01L 23/31* | (2006.01) |

(52) U.S. Cl.
CPC ............ *H01L 23/52* (2013.01); *H01L 23/3735* (2013.01); *H01L 23/467* (2013.01); *H01L 24/34* (2013.01); *H01L 25/072* (2013.01); *H05K 7/1432* (2013.01); *H01L 23/645* (2013.01); *H01L 23/3121* (2013.01)
USPC .................... 257/691; 257/684; 257/E23.075; 361/104; 361/729

(58) Field of Classification Search
USPC .......... 257/684, 690, 691, E23.075; 361/104, 361/729; 438/106, 125
See application file for complete search history.

(56) References Cited

U.S. PATENT DOCUMENTS

| 6,545,364 B2 * | 4/2003 | Sakamoto et al. ............. 257/773 |
| RE43,663 E * | 9/2012 | Kawashima et al. ......... 257/678 |
| 8,519,561 B2 | 8/2013 | Azuma et al. |
| 2013/0105961 A1 * | 5/2013 | Jones et al. ................... 257/691 |

FOREIGN PATENT DOCUMENTS

| JP | 2006-202885 A | 8/2006 |
| JP | 201115460 A | 1/2011 |

* cited by examiner

*Primary Examiner* — Phuc Dang
(74) *Attorney, Agent, or Firm* — Sughrue Mion, PLLC

(57) ABSTRACT

A semiconductor unit includes a first conductive layer, a second conductive layer electrically insulated from the first conductive layer, a first semiconductor device mounted on the first conductive layer, a second semiconductor device mounted on the second conductive layer, a first bus bar for electrical connection of the second semiconductor device to the first conductive layer, and a second bus bar for electrical connection of the first semiconductor device to one of the positive and negative terminals of a battery. The first bus bar is disposed in overlapping relation to the second bus bar in such a manner that mold resin fills between the first bus bar and the second bus bar.

8 Claims, 4 Drawing Sheets

SEMICONDUCTOR UNIT

BACKGROUND OF THE INVENTION

The present invention relates to a semiconductor unit having a semiconductor device that is to be electrically connected to a power source through a bus bar.

Japanese Unexamined Patent Application Publication No. 2006-202885 discloses a semiconductor unit which can be used for example as an electric power converter. The semiconductor unit has an IGBT (insulated gate bipolar transistor) as a semiconductor device and a diode. The collector of the IGBT and the bottom electrode of the diode are soldered to a block serving to release the heat generated by the IGBT and the diode and also to connect the bottom side of the IGBT to the bottom side of the diode. The emitter of the IGBT and the top electrode of the diode are connected by a lead.

There has been a demand for a semiconductor unit of a lower inductance in order to reduce the amount of heat generated during the operation of the unit. There also has been a demand for a semiconductor unit of a smaller size when the unit is used in an environment such as an automobile.

The present invention is directed to providing a semiconductor unit of a structure that allows reduced inductance and size.

SUMMARY OF THE INVENTION

In accordance with an aspect of the present invention, a semiconductor unit includes a first conductive layer, a second conductive layer electrically insulated from the first conductive layer, a first semiconductor device mounted on the first conductive layer, a second semiconductor device mounted on the second conductive layer, a first bus bar for electrical connection of the second semiconductor device to the first conductive layer, and a second bus bar for electrical connection of the first semiconductor device to one of the positive and negative terminals of a battery. The first bus bar is disposed in overlapping relation to the second bus bar in such a manner that mold resin fills between the first bus bar and the second bus bar.

In accordance with another aspect of the present invention, a semiconductor unit includes a first conductive layer, a second conductive layer electrically insulated from the first conductive layer, a first semiconductor device mounted on the first conductive layer, a second semiconductor device mounted on the second conductive layer, and two bus bars, one of which provided for electrical connection of the first semiconductor device to one of the positive and negative terminals of a battery, the other of which provided for electrical connection of the second conductive layer to the other of the positive and is negative terminals of the battery. The two bus bars are disposed in overlapping relation to each other in such a manner that mold resin fills between the bus bars.

Other aspects and advantages of the invention will become apparent from the following description, taken in conjunction with the accompanying drawings, illustrating by way of example the principles of the invention.

DETAILED DESCRIPTION OF THE EMBODIMENTS

Figure 1:
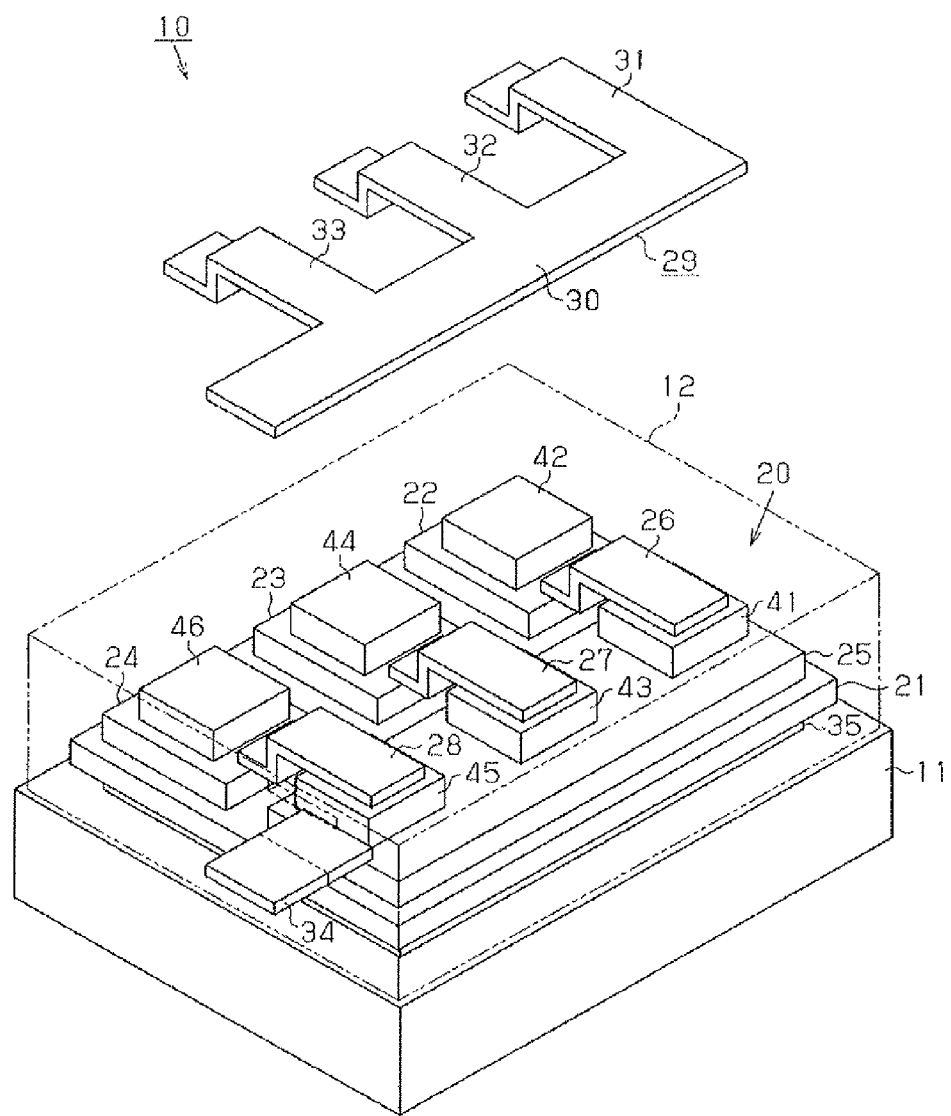
FIG. 1 is an exploded perspective view of a three-phase inverter as an embodiment of a semiconductor unit according to the present invention.

The following will describe the three-phase inverter as one embodiment of the semiconductor unit according to the present invention with reference to FIGS. 1 through 5. Referring to FIG. 1, the three-phase inverter which is designated generally by 10 includes a circuit board 20, six semiconductor devices 41, 42, 43, 44, 45 and 46 mounted on the circuit board 20, and a cooler 11 or heat radiation member thermally coupled to the circuit board 20. It is noted that the upper and lower sides as viewed in FIG. 1 are the upper and lower sides of the inverter 10, respectively.

The circuit board 20 includes a rectangular ceramic substrate 21 or insulation layer, and first, second, third and fourth metal plates 22, 23, 24 and 25 each laminated to the top surface of the ceramic substrate 21. The metal plates 22 to 25 are electrically insulated from one another and each is made of a conductive material such as aluminum.

The first, second and third metal plates 22, 23 and 24 are arranged in longitudinal direction of the ceramic substrate 21. The fourth metal plate 25 and each of the first, second and third metal plates 22, 23 and 24 are arranged in transverse direction of the ceramic substrate 21. In the present embodiment, the first, second and third metal plates 22, 23 and 24 correspond to the first conductive layer of the present invention, and the fourth metal plate 25 corresponds to the second conductive layer of the present invention.

Of the six semiconductor devices 41 to 46, three semiconductor devices 42, 44, 46, which will be hereinafter referred to as the first semiconductor devices, are mounted on the first, second and third metal plates 22, 23, 24, respectively, and the rest of three semiconductor devices 41, 43, 45, which will be hereinafter referred to as the second semiconductor devices, are mounted on the fourth metal plate 25.

Figure 2:
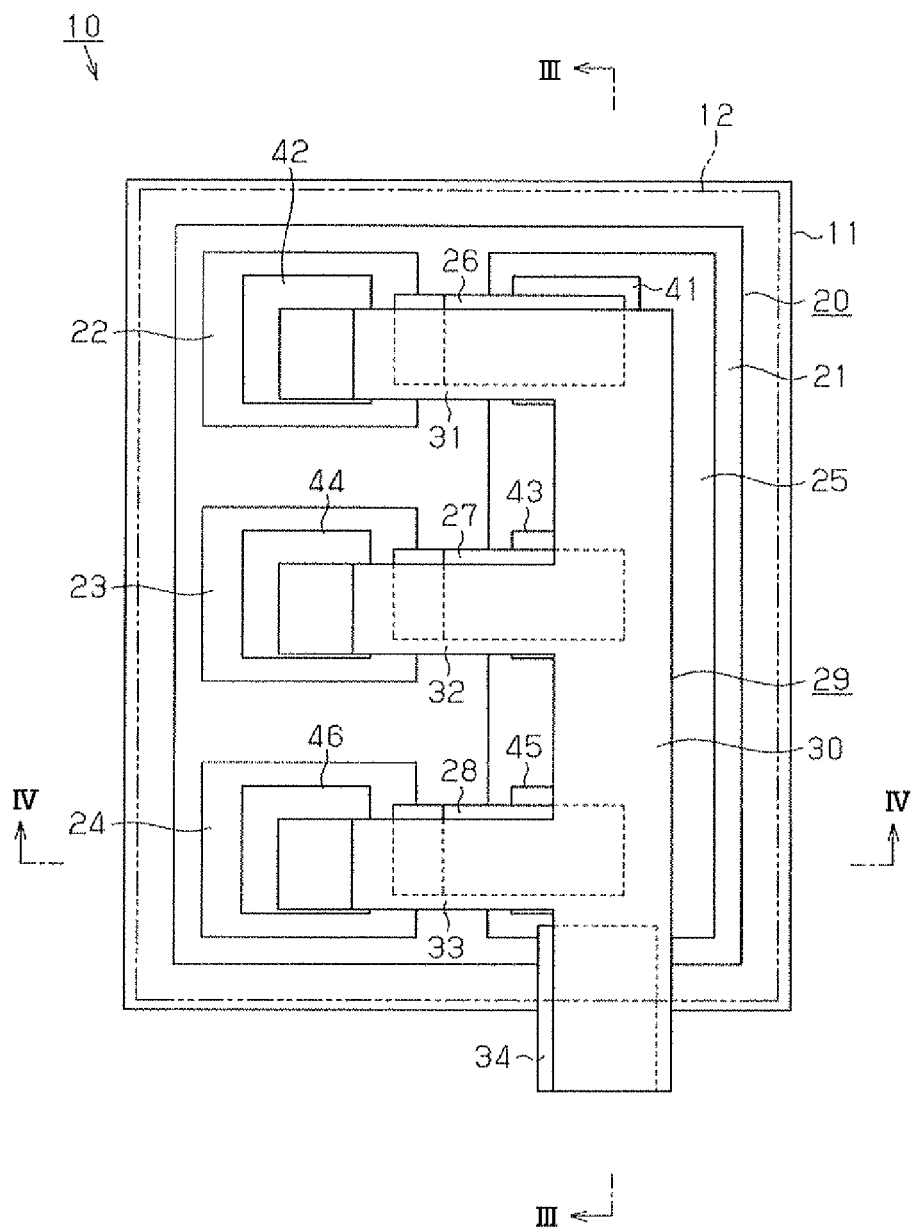
FIG. 2 is a plan view of the three-phase inverter of FIG. 1.

Referring to FIG. 2, the inverter 10 includes first bus bars 26, 27, 28 having a rectangular profile in plan view and bonded to the respective metal plates 22, 23, 24. The first bus bar 26 is bonded at one longitudinal end thereof to the top surface of the first metal plate 22 and at the opposite longitudinal end thereof to the top surface of the second semiconductor device 41. The first bus bar 27 is bonded at one longitudinal end thereof to the top surface of the first metal plate 23 and at the opposite longitudinal end thereof to the top surface of the second semiconductor device 43. The first bus bar 28 is bonded at one longitudinal end thereof to the top surface of the first metal plate 24 and at the opposite longitudinal end thereof to the top surface of the second semiconductor device 45. The first bus bars 26, 27, 28 electrically connect the metal plates 22, 23, 24 to the second semiconductor devices 41, 43, 45, respectively.

The inverter 10 includes a second bus bar 29 bonded to the top surfaces of the respective first semiconductor devices 42, 44, 46 for electrical connection to a negative terminal of a power source (not shown). The second bus bar 29 has a base 30 having a rectangular profile in plan view, and connecting portions 31, 32, 33 having a rectangular profile in plan view and extending from the base 30. The connecting portions 31, 32, 33 are spaced from each other longitudinally of the base 30 and extending transversely of the base 30. The connecting portions 31, 32, 33 are bonded to the top surfaces of the first semiconductor devices 42, 44, 46, respectively. The second bus bar 29 electrically connects the first semiconductor devices 42, 44, 46 to the negative terminal of the power source.

The inverter 10 further includes a third bus bar 34 bonded to the fourth metal plate 25 for electrical connection to a positive terminal of the power source. The third bus bar 34 electrically connects the fourth metal plate 25 to the positive terminal of the power source. The second and third bus bars 29, 34 are electrically connected to the power source terminals of different polarities.

Figure 3:
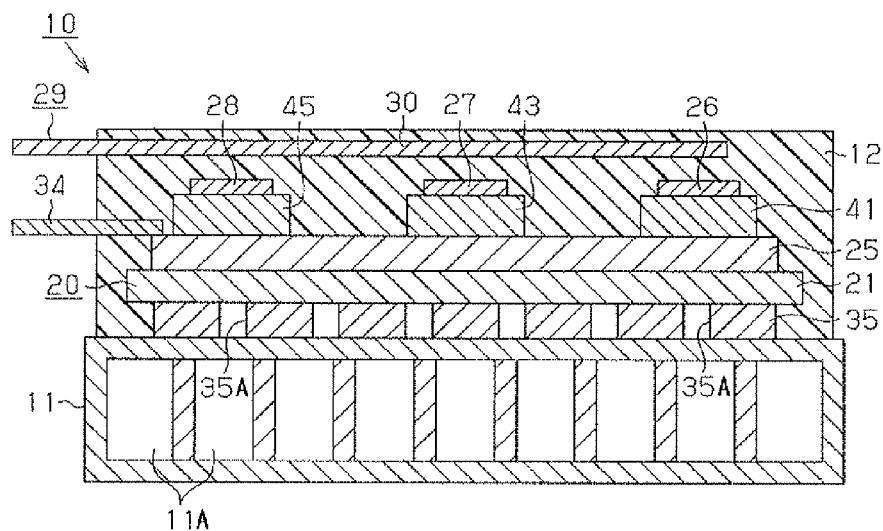
FIG. 3 is a sectional view taken along the line III-III of FIG. 2.

As shown in FIGS. 2 and 3, the base 30 of the second bus bar 29 is disposed in overlapping relation to the third bus bar 34 as seen in the direction of their thickness. As seen in plan view in FIG. 2, the base 30 of the second bus bar 29 and the third bus bar 34 are so positioned that their imaginary longitudinal center lines are parallel each other but offset from each other in the transverse direction of the base 30. Thus, the base 30 of the second bus bar 29 has a portion that overlaps the third bus bar 34 as seen in the direction of their thickness, that is, the direction in which the ceramic substrate 21 and the respective metal plates 22 to 25 are laminated.

Figure 4:
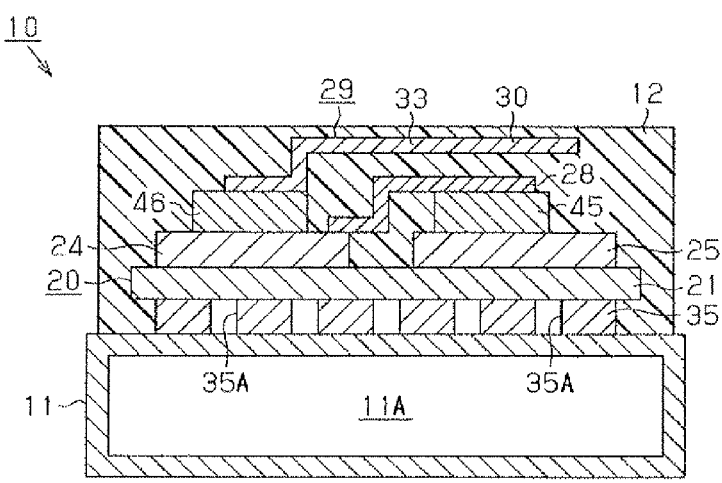
FIG. 4 is a sectional view taken along the line IV-IV of FIG. 2.

As shown in FIGS. 2 and 4, the first bus bars 26, 27, 28 are disposed in overlapping relation to base 30 and the respective connecting portions 31, 32, 33 of the second bus bar 29 as seen in the direction of their thickness. As seen in plan view in FIG. 2, the connecting portions 31, 32, 33 of the second bus bar 29 and the first bus bars 26, 27, 28 are so positioned that their imaginary longitudinal center lines are parallel each other but offset from each other in the transverse direction of the connecting portions 31, 32. 33. Thus, the second bus bar 29 has a portion that overlaps the first bus bars 26, 27, 28 in the direction of their thickness, that is, the direction in which the ceramic substrate 21 and the respective metal plates 22 to 25 are laminated.

As shown in FIG. 2, the third bus bar 34, the second bus bar 29 and the first bus bars 26 to 28 have surfaces overlapping the metal plates 22 to 25 and oriented parallel to the metal plates 22 to 25. In other words, the third bus bar 34, the second bus bar 29 and the first bus bars 26 to 28 are disposed extending parallel to the metal plates 22 to 25.

As shown in FIG. 3, there is provided a stress relief member 35 on the bottom surface of the ceramic substrate 21. The stress relief member 35 is a metal plate, such as an aluminum plate, and has plural holes 35A extending therethrough in the direction of its thickness.

The stress relief member 35 is interposed between and bonded to the ceramic substrate 21 and the cooler 11. The cooler 11 has therein plural straight channels 11A through which coolant flows. Although not shown in the drawing, the cooler 11 has an inlet and an outlet through which coolant flows into and out of the channels 11A.

In the three-phase inverter 10 of the present embodiment, the cooler 11 and the components mounted thereon are molded by an insulating mold resin 12. Specifically, the mold resin 12 covers part of the top surface of the cooler 11 and also covers the first semiconductor devices 42, 44, 46, the second semiconductor devices 41, 43, 45, the metal plates 22 to 25, the ceramic substrate 21, the stress relief member 35, the first bus bars 26 to 28, the second bus bar 29 and the third bus bar 34. The mold resin 12 fills between such components, specifically between the second bus bar 29 and the third bus bar 34 and also between the second bus bar 29 and the first bus bars 26 to 28. Part of the third bus bar 34 and part of the base 30 of the second bus bar 29 project out of the mold resin 12, to which the power source is electrically connected through, for example, an external electrode.

Figure 5:
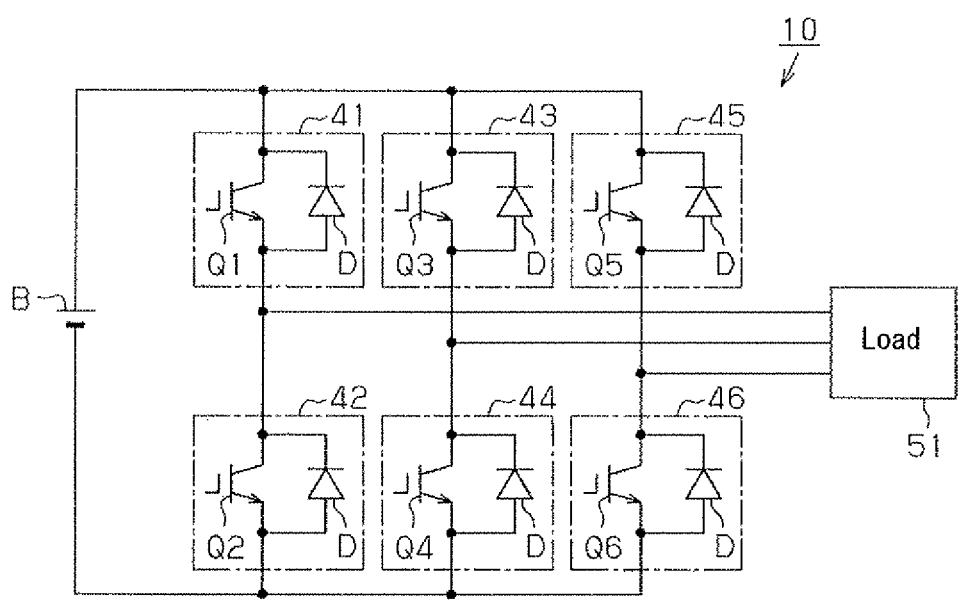
FIG. 5 is an electric circuit diagram of the three-phase inverter of FIG. 1.

FIG. 5 shows an electric circuit diagram of the inverter 10 of the present embodiment. Each of the semiconductor devices 41, 42, 43, 44, 45, 46 has one device incorporating one switching device such as Q1, Q2, Q3, Q4, Q5, Q6 and one diode D. The switching devices q1, Q3, Q5 in the respective second semiconductor devices 41, 43, 45 function as the upper arm of the inverter 10. The switching devices Q2, Q4, Q6 in the respective first semiconductor devices 42, 44, 46 function as the lower arm of the inverter 10. The switching devices Q1 to Q6 may be provided by a power semiconductor device such as an IGBT (insulated gate bipolar transistor) or power MOSFET (metal oxide semiconductor field effect transistor). The gates and emitters of the respective switching devices Q1 to Q6 are provided on the top surfaces of the respective semiconductor devices 41 to 46, and the collectors of the respective switching devices Q1 to Q6 are provided on the bottom surfaces of the respective semiconductor devices 41 to 46. The anodes of the respective diodes D are provided on the top surfaces of the respective semiconductor devices 41 to 46, and the cathodes of the respective diodes D are provided on the bottom surfaces of the respective semiconductor devices 41 to 46.

The switching devices Q1, Q2 are connected in series, the switching devices Q3, Q4 are connected in series, and the switching devices Q5, Q6 are connected in series.

The collectors of the switching devices Q1, Q3, Q5 are connected through the fourth metal plate 25 and the third bus bar 34 to the positive terminal of a battery B or the power source. The emitters of the switching devices Q2, Q4, Q6 are connected through the second bus bar 29 to the negative terminal of the battery B.

The diode D for each of the switching devices Q1 to Q6 is connected in reverse parallel between the emitter and the collector, specifically the diode D is connected at its cathode to the emitter and at its anode to the collector.

The connections between the switching devices Q1, Q2, between the switching devices Q3, Q4 and also between the switching devices Q5, Q6 are connected to a load 51 such as a three-phase motor. The inverter 10 converts DC power of the battery B into AC power to be supplied to the load 51.

In the above-described inverter 10, each of the first bus bars 26, 27, 28 has a portion that overlaps the second bus bar 29 in the direction of their thickness, and the second bus bar 29 has a portion that overlaps the third bus bar 34 in the direction of their thickness. The direction of electric current flowing through the first bus bars 26, 27, 28 and through the third bus bar 34 is opposite from the direction of electric current flowing through the second bus bar 29. Thus, the magnetic flux produced by the current flowing through the first bus bars 26, 27, 28 and the third bus bar 34 is cancelled by the magnetic flux produced by the current flowing through the second bus bar 29 due to mutual induction.

The mold resin 12 fills between the second bus bar 29 and the respective first bus bars 26, 27, 28 and also between the second bus bar 29 and the third bus bar 34. During the operation of the Inverter 10 when current flows through the first bus bars 26, 27, 28, the second bus bar 29 and the third bus bar 34, the mold resin 12 functions as the insulation layer that insulates the first bus bars 26, 27, 28 from the second bus bar 29 and also the second bus bar 29 from the third bus bar 34.

The inverter 10 of the present embodiment offers the following advantages.

(1) Each of the first bus bars 26, 27, 28 has a portion that overlaps the second bus bar 29 in the direction of their thickness. Mutual induction occurring between the second bus bar 29 and the respective first bus bars 26, 27, 28 results in reduced inductance of the inverter 10. The mold resin 12 present between the first bus bars 26, 27, 28 and the second bus bar 29 functions as the layer for insulation therebetween and hence allows less distance between the first bus bars 26, 27, 28 and the second bus bar 29 for the insulation therebetween. This prevents an increase of the distance between the first bus bars 26, 27, 28 and the second bus bar 29 for the insulation therebetween, resulting in reduced size of the inverter 10.

(2) The second bus bar 29 has a portion that overlaps the third bus bar 34 in the direction of their thickness. Mutual induction occurring between the second bus bar 29 and the third bus bar 34 results in further reduced inductance of the inverter 10. The mold resin 12 present between the second bus bar 29 and third bus bar 34 functions as the insulation layer for the insulation therebetween, which prevents an increase of the distance between the second bus bar 29 and the third bus bar 34, resulting in further reduced size of the inverter 10.

(3) The provision of the metal plates 22 to 25 on the ceramic substrate 21 provides good insulation of the metal plates 22 to 25.

(4) The cooler 11 is bonded to the bottom surface of the ceramic substrate 21. The heat generated by the semiconductor devices 41 to 46 is transferred through the ceramic substrate 21 to the cooler 11 and radiated therefrom.

(5) The stress relief member 35 interposed between the ceramic substrate 21 and the cooler 11 serves to reduce the thermal stress caused by the difference in the coefficient of linear expansion between the cooler 11 and the ceramic substrate 21. This prevents cracks from occurring at the connections between the ceramic substrate 21 and the stress relief member 35 and between the stress relief member 35 and the cooler 11, thereby preventing the cooler 11 from being detached from the stress relief member 35.

(6) The switching devices Q1 to Q6 are used as the respective semiconductor devices 41 to 46 so that the switching devices Q1, Q2 are serially connected, the switching devices Q3, Q4 are serially connected and the switching devices Q5, Q6 are serially connected. Each of the pairs of such serially connected switching devices Q1, Q2, the switching devices Q3, Q4, and the switching devices Q5, Q6 constitutes one phase of the three-phase inverter 10.

(7) The use of the cooler 11 as the heat radiation member having the plural channels 11A allows efficient radiation of the heat generated by the semiconductor devices 41 to 46 by the coolant flowing through the channels 11A of the cooler 11.

(8) The offset arrangement of the second bus bar 29 relative to the first bus bars 26, 27, 28 and the third bus bar 34 helps to fill the resin between the second bus bar 29 and the first bus bars 26, 27, 28 and between the second bus bar 29 and the third bus bar 34 during the process of resin molding (9) Such offset arrangement of the second bus bar 29 also makes it easy to check the part where the second bus bar 29, the first bus bars 26, 27, 28 and the third bus bar 34 are bonded by means such as soldering.

(10) The offset arrangement of the second bus bar 29 also facilitates the bonding of the second bus bar 29, the first bus bars 26, 27, 28 and the third bus bar 34 by means such as soldering.

The above embodiment may be modified in various ways as exemplified below.

According to the present invention, it may be so modified that the second bus bar 29 is disposed in overlapping relation to only the first bus bars 26, 27, 28 or the third bus bar 34 and also that the mold resin 12 fills between such bus bars disposed in overlapping relation to each other. Alternatively, the second bus bar 29 may be disposed in overlapping relation to at least one of the first bus bars 26, 27, 28.

The third bus bar 34 and the second bus bar 29 may be oriented not only parallel to the metal plates 22 to 25, but also perpendicular to the metal plates 22 to 25. In this case, the third bus bar 34 and the second bus bar 29 are disposed extending in the direction in which the ceramic substrate 21 and the metal plates 22 to 25 are laminated. This helps to reduce the size of the inverter 10 as measured along the metal plates 22 to 25.

In the case that the cooler 11 is made of an insulating material or the top surface of the cooler 11 is coated with an insulating material, the inverter 10 may dispense with the ceramic substrate 21 and the metal plates 22 to 25 may be bonded directly to the cooler 11. Alternatively, the metal plates 22 to 25 may be provided on any insulating member other than the cooler 11.

The inverter 10 may dispense with the cooler 11 as long as the heat generated during the operation of the inverter 10 can be released enough by means other than the cooler 11.

The inverter 10 may dispense with the stress relief member 35 as long as the thermal stress occurring during the operation of the inverter 10 is low enough. In this case, the cooler 11 is brazed to the bottom surface of the ceramic substrate 21.

The cooler 11 may be replaced by any suitable planar heat radiation member.

The present invention is applicable not only to a three-phase inverter such as 10, but also to a single-phase inverter or DC-DC converter.

What is claimed is:

1. A semiconductor unit, comprising:
   a first conductive layer;
   a second conductive layer electrically insulated from the first conductive layer;
   a first semiconductor device mounted on the first conductive layer;
   a second semiconductor device mounted on the second conductive layer;
   a first bus bar for electrical connection of the second semiconductor device to the first conductive layer; and
   a second bus bar for electrical connection of the first semiconductor device to one of the positive and negative terminals of a battery,
      wherein the first bus bar is disposed in overlapping relation to the second bus bar in such a manner that mold resin fills between the first bus bar and the second bus bar.

2. The semiconductor unit of claim 1, further comprising a third bus bar for electrical connection of the second conductive layer to the other of the positive and negative terminals of the battery,
   wherein the second bus bar is disposed in overlapping relation to the third bus bar in such a manner that mold resin fills between the second bus bar and the third bus bar.

3. The semiconductor unit of claim 2, further comprising an insulation layer to which the first conductive layer and the second conductive layer are bonded.

4. The semiconductor unit of claim 3, further comprising a heat radiation member bonded to the insulation layer.

5. The semiconductor unit of claim 4, further comprising a stress relief member provided between the insulation layer and the heat radiation member.

6. The semiconductor unit of claim 2, wherein the first semiconductor device includes three lower-arm switching devices each having a collector and an emitter, the second semiconductor device includes three upper-arm switching devices each having a collector and an emitter, the number of first conductive layers is three, the lower-arm switching devices are electrically connected at their collectors to the respective first conductive layers, the upper-arm switching devices are electrically connected at their collectors to the second conductive layer, the upper-arm switching devices are electrically connected at their emitters to the respective first conductive layers through the first bus bar, the lower-arm switching devices are electrically connected at their emitters to the negative terminal of the battery through the second bus bar, and the third bus bar is connected to the second conductive layer.

7. The semiconductor unit of claim 4, wherein the heat radiation member is a cooler having therein plural coolant channels.

8. A semiconductor unit, comprising:
   a first conductive layer;
   a second conductive layer electrically insulated from the first conductive layer;
   a first semiconductor device mounted on the first conductive layer;
   a second semiconductor device mounted on the second conductive layer; and
   two bus bars, wherein one of the bus bars is provided for electrical connection of the first semiconductor device to one of the positive and negative terminals of a battery, and an other one of the bus bars is provided for electrical connection of the second conductive layer to the other of the positive and negative terminals of the battery;
   wherein the two bus bars are disposed in overlapping relation to each other in such a manner that mold resin fills between the bus bars.

* * * * *